US007786475B2

(12) United States Patent
Kulkarni et al.

(10) Patent No.: US 7,786,475 B2
(45) Date of Patent: Aug. 31, 2010

(54) IN-LINE TEST CIRCUIT AND METHOD FOR DETERMINING INTERCONNECT ELECTRICAL PROPERTIES AND INTEGRATED CIRCUIT INCORPORATING THE SAME

(75) Inventors: Makarand R. Kulkarni, Richardson, TX (US); Andrew Marshall, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 555 days.

(21) Appl. No.: 11/383,853

(22) Filed: May 17, 2006

(65) Prior Publication Data

US 2007/0269912 A1   Nov. 22, 2007

(51) Int. Cl.
*H01L 29/10* (2006.01)
(52) U.S. Cl. .................. 257/48; 324/158.1; 324/73.1; 714/731; 257/E21.521
(58) Field of Classification Search .............. 257/48; 324/168.1, 73.1; 714/731
See application file for complete search history.

(56) References Cited

U.S. PATENT DOCUMENTS

| 5,321,277 | A | 6/1994 | Sparks et al. |
| 5,432,441 | A * | 7/1995 | El-Ayat et al. ........... 324/158.1 |
| 5,790,479 | A | 8/1998 | Conn |
| 6,073,261 | A * | 6/2000 | Miller ........................ 714/731 |
| 6,304,097 | B1 | 10/2001 | Chen |
| 6,423,558 | B1 | 7/2002 | Maeda et al. |
| 2001/0013781 | A1 | 8/2001 | De Jong et al. |

* cited by examiner

*Primary Examiner*—Thao X Le
*Assistant Examiner*—Elias Ullah
(74) *Attorney, Agent, or Firm*—Warren L. Franz; Wade J. Brady, III; Frederick J. Telecky, Jr.

(57) ABSTRACT

A test circuit for, and method of, determining electrical properties of an underlying interconnect layer and an overlying interconnect layer of an integrated circuit (IC) and an IC incorporating the test circuit or the method. In one embodiment, the test circuit includes a gate chain having a ring path and a stage. In one embodiment, the stage includes: (1) a underlying test segment in the underlying interconnect layer, (2) a overlying test segment in the overlying interconnect layer and (3) logic circuitry activatible after formation of the underlying interconnect layer and before formation of the overlying interconnect layer to place the underlying test segment in the ring path and further activatible after the formation of the overlying interconnect layer to substitute the overlying test segment for the underlying test segment in the ring path.

14 Claims, 2 Drawing Sheets

130 TEST CIRCUIT
110 PRINCIPAL CIRCUIT

IN-LINE TEST CIRCUIT AND METHOD FOR DETERMINING INTERCONNECT ELECTRICAL PROPERTIES AND INTEGRATED CIRCUIT INCORPORATING THE SAME

TECHNICAL FIELD OF THE INVENTION

The present invention is directed, in general, to and, more particularly, to an in-line test circuit and method for determining interconnect electrical properties and an integrated circuit (IC) incorporating the same.

BACKGROUND OF THE INVENTION

ICs, which form a vital part of a vast array of modern electronic equipment, have become steadily but dramatically smaller, faster, more sophisticated and more power-efficient. However, as ICs have shrunk in size and voltage and grown in speed, the electrical properties (e.g., capacitance or resistance) of the metal or polysilicon conductors ("interconnects") used within the ICs have become material to proper performance.

An IC is fabricated by forming devices in or on a single substrate, often composed of silicon. The result is one or more "device layers." Then, interconnects are formed to integrate the devices together into one or more electrical circuits. Often, the interconnects are arranged in multiple layers ("interconnect layers") that overlie the devices. A sophisticated IC, such as a digital signal processor ("DSP") may have ten or more interconnect layers overlying its devices.

Those skilled in the art of IC fabrication understand that the processes used to form the interconnect layers often produce variations in interconnect cross-section from one layer to the next and from one IC to the next that result in varying electrical properties. The electrical properties may vary to such a degree that the IC does not function properly. Thus, it is highly desirable to ensure that the interconnect fabrication processes are producing interconnects of acceptable cross-section in each layer.

Unfortunately, testing interconnects to determine whether they have acceptable electrical properties involves either measuring the cross-sectional area of the interconnects to derive their properties or directly measuring the properties by means of dedicated test equipment having many tiny test probes. Either way, testing interconnects has necessarily involved removing ICs from the production line to a test station or facility. This not only requires the test station or facility to be purchased and maintained, but complexity and delays are also introduced into the fabrication process, all of which increases cost. Testing ICs having multiple interconnect layers involves multiple trips to the test station or facility and is therefore particularly costly.

Accordingly, what is needed in the art is a better way to test the electrical properties of interconnects in an IC. More specifically, what is needed in the art is a way to test the electrical properties of interconnects without having to remove the IC from the production line. Still more specifically, what is needed in the art is a way to test the electrical properties of interconnects without having to measure their cross-section or the electrical properties themselves. Yet more specifically, what is needed in the art is an in-line test circuit that fits within a relatively small amount of area on an IC, allowing it to be replicated and placed at several locations within the IC without significantly increasing IC cost.

SUMMARY OF THE INVENTION

To address the above-discussed deficiencies of the prior art, the present invention provides, in one aspect, a test circuit for determining electrical properties of an underlying interconnect layer and an overlying interconnect layer of an IC. In one embodiment, the test circuit includes a gate chain having a ring path and a stage. In one embodiment, the stage includes: (1) an underlying test segment in the underlying interconnect layer, (2) an overlying test segment in the overlying interconnect layer; and (3) logic circuitry activatible after formation of the underlying interconnect layer and before formation of the overlying interconnect layer to place the underlying test segment in the ring path, and further activatible after the formation of the overlying interconnect layer to substitute the overlying test segment for the underlying test segment in the ring path.

Another aspect of the present invention provides a method of determining electrical properties of an underlying interconnect layer and an overlying interconnect layer of an IC. In one embodiment, the method includes: (1) placing an underlying test segment in the underlying interconnect layer in a ring path of a gate chain after formation of the underlying interconnect layer and before formation of the overlying interconnect layer; and (2) substituting an overlying test segment in the overlying interconnect layer for the underlying test segment in the ring path after the formation of the overlying interconnect layer.

Still another aspect of the present invention provides an IC. In one embodiment, the IC includes: (1) a device layer, (2) an underlying interconnect layer overlying the device layer, (3) an overlying interconnect layer overlying the underlying interconnect layer, (4) a principal circuit having devices in the device layer and interconnects in the underlying and overlying interconnect layers; and (5) a test circuit for determining electrical properties of the underlying and overlying interconnect layers and thereby testing the principal circuit. In one embodiment, the test circuit includes a gate chain having devices in the device layer, a ring path and a stage. In one embodiment, the gate chain includes: (1) an underlying test segment in the underlying interconnect layer, (2) an overlying test segment in the overlying interconnect layer; and (3) logic circuitry activatible after formation of the underlying interconnect layer and before formation of the overlying interconnect layer to place the underlying test segment in the ring path, and further activatible after the formation of the overlying interconnect layer to substitute the overlying test segment for the underlying test segment in the ring path.

The foregoing has outlined preferred and alternative features of the present invention so that those skilled in the pertinent art may better understand the detailed description of the invention that follows. Additional features of the invention will be described hereinafter that form the subject of the claims of the invention. Those skilled in the pertinent art should appreciate that they can readily use the disclosed conception and specific embodiment as a basis for designing or modifying other structures for carrying out the same purposes of the present invention. Those skilled in the pertinent art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawings, in which.

DETAILED DESCRIPTION

Figure 1:
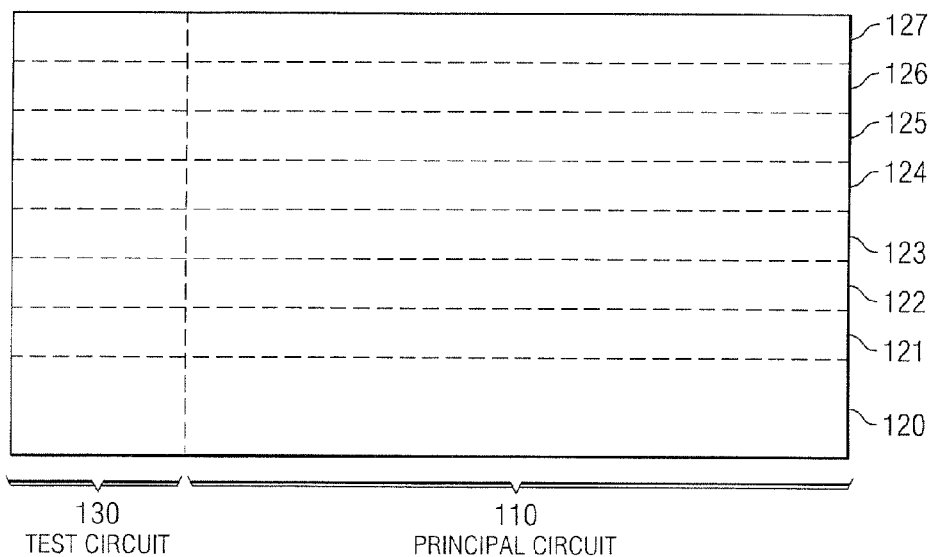
FIG. 1 illustrates a block diagram and a high-level schematic of one embodiment of an IC incorporating a test circuit for determining interconnect electrical properties constructed according to the principles of the present invention.

FIG. 1 illustrates a block diagram and a high level schematic of one embodiment of an IC, generally designated 100 and constructed according to the principles of the present invention. The IC 100 includes a principal circuit 110 and a test circuit 130.

The principal circuit 110 ostensibly forms the majority of the area of the IC 100 and performs functions for the benefit of the end-user of the IC 100. For example, if the IC 100 is a DSP, the principal circuit 110 is a DSP circuit. If the IC 100 is a static random access memory (SRAM) chip, the principal circuit 110 is an SRAM array and associated control circuitry.

In contrast, the test circuit 130 performs test functions primarily for the benefit of the IC's manufacturer, allowing the manufacturer to test the electrical properties of the interconnect layers in the IC 100 and thereby test, at least to some extent, the principal circuit 110.

The IC 100 includes multiple layers. The lowest layer, as the IC 100 is oriented in FIG. 1, is a device layer 120 formed on or in a substrate which may be composed of silicon or any other conventional or later-developed material. The substrate may, for example be silicon-on-insulator (SOI).

The device layer 120 contains devices constituting both the principal circuit 110 and the test circuit 130. Overlying and formed after the device layer 120 is a first interconnect layer 121. Overlying and formed after the first interconnect layer 121 is a second interconnect layer 122. Overlying and formed after the second interconnect layer 122 is a third interconnect layer 123. Overlying and formed after the third interconnect layer 123 is a fourth interconnect layer 124. Overlying and formed after the fourth interconnect layer 124 is a fifth interconnect layer 125. Overlying and formed after the fifth interconnect layer 125 is a sixth interconnect layer 126. Finally, overlying and formed after the sixth interconnect layer 126 is a seventh interconnect layer 127. Thus, the particular IC 100 of FIG. 1 consists of seven interconnect layers 121-127. Those skilled in the pertinent art will understand, however, that the invention may be applied to any number of interconnect layers.

The interconnect layers 121-127 may include metal, polysilicon or any substance suitable for conducting electricity among devices. Thus the term "interconnect layer" refers to a (typically patterned) layer of conductors and does not necessarily include surrounding insulators, vias or other structure that may accompany the layer of conductors.

The principal circuit 110 has devices (not shown) in the device layer 120 and interconnects in the overlying interconnect layers 121-127. Likewise, the test circuit 130 has devices (not shown) in the device layer 120. The interconnects of the test circuit 130 are predominantly in the first interconnect layer 121. This allows the test circuit 130 to be activated and function after only the first interconnect layer 121 has been formed. However, certain interconnects (called "test segments") of the test circuit 130 are in the second through seventh interconnect layers 122-127. As will be described below, these test segments come into being as their respective interconnect layers are formed and are substituted into the test circuit 130 when the test circuit 130 is activated.

Having described the test circuit 130 in terms of its surroundings in the IC 100, a gate chain, which forms a part of the test circuit 130, will now be described. While the various embodiments of the gate chain to be illustrated and described take the form of ring oscillators, those skilled in the pertinent art will understand that the invention includes gate chains of all types.

Figure 2:
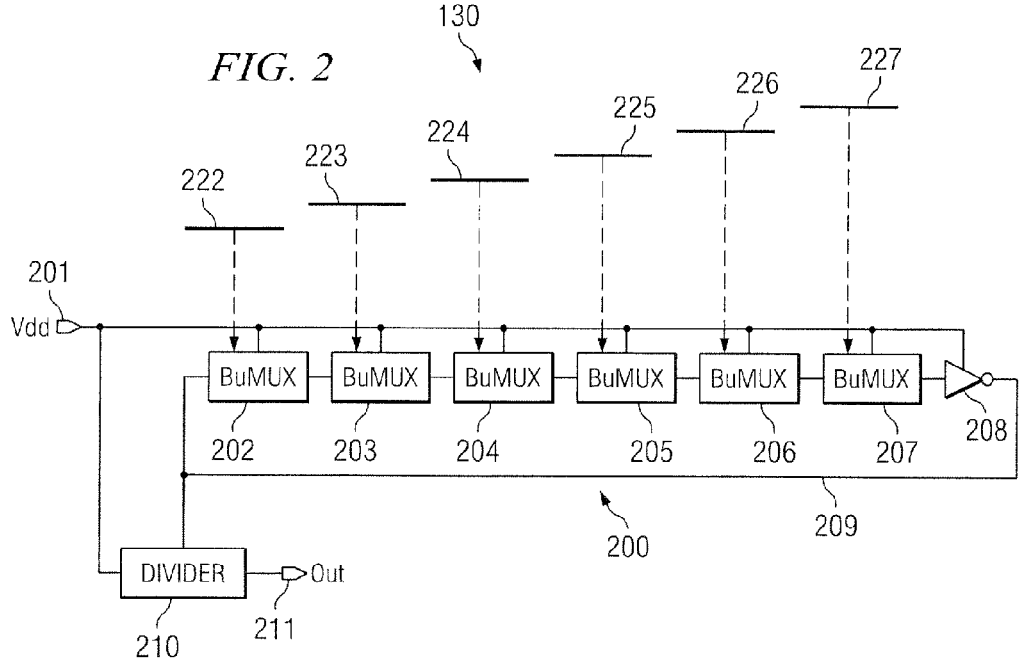
FIG. 2 illustrates a block diagram of one embodiment of a ring oscillator in the test circuit of FIG. 1 constructed according to the principles of the present invention.

Accordingly, turning now to FIG. 2, illustrated is a block diagram of one embodiment of a ring oscillator 200 in the test circuit 130 of FIG. 1 constructed according to the principles of the present invention.

A power supply input ("Vdd") 201 is configured to receive power to activate the ring oscillator 200. The ring oscillator 200 includes a plurality of dual-inverter stages labeled "BuMUX." A first stage is designated 202, a second stage is designated 203, a third stage is designated 204, a fourth stage is designated 205, a fifth stage is designated 206, and a sixth stage is designated 207. Since ring oscillators must have an odd number of inverters to operate, a single terminating inverter 208 is included in the ring oscillator 200. A ring path 209 couples and includes the stages 202-207 and the inverter 208 and loops back to the first stage 202 in the manner shown. Thus, the ring path 209 acts as a feedback loop.

In the embodiment of FIG. 2, the dual-inverters 202, 203, 204, 205, 206, 207 and the inverter 208 are interconnected in a first interconnect layer, establishing the ring path 209 and allowing the ring oscillator 200 to begin to function when only the first interconnect layer is present. In the embodiment of FIG. 2, each dual-inverter stage 202-207 of the ring oscillator is associated with, and therefore is coupled to a test segment in, one of the overlying interconnect layers. The first stage 202 is coupled to a test segment 222 in a second interconnect layer (e.g., the second interconnect layer 122 of FIG. 1). The second stage 203 is coupled to a test segment 223 in a third interconnect layer (e.g., the third interconnect layer 123 of FIG. 1). The third stage 204 is coupled to a test segment 224 in a fourth interconnect layer (e.g., the fourth interconnect layer 124 of FIG. 1). The fourth stage 205 is coupled to a test segment 225 in a fifth interconnect layer (e.g., the fifth interconnect layer 125 of FIG. 1). The fifth stage 206 is coupled to a test segment 226 in a sixth interconnect layer (e.g., the sixth interconnect layer 126 of FIG. 1). Finally, the sixth stage 207 is coupled to a test segment 227 in a seventh interconnect layer (e.g., the seventh interconnect layer 127 of FIG. 1). Though the manner in which each of the stages 202-207 is coupled to its respective test segment will be described in greater detail below, FIG. 2 schematically represents the coupling with a broken-line arrow extending from each test segment 222-227 to each respective stage 202-207.

Those skilled in the art understand that a ring oscillator 200, once activated, begins to oscillate on its own at a frequency that is a function of the electrical properties of the inverters and interconnects in the ring path 209. This frequency is typically quite high, perhaps in the gigahertz range. Therefore, a frequency divider 210 may be coupled to the ring path to provide an output frequency at an output ("Out") 211 that is somewhat lower and therefore easier to measure on the production line, particularly, the Back-End-Of-The-Line (BEOL), without requiring exotic test equipment. Thus, operating the test circuit 130 involves providing power to the power supply input 201 and reading an output frequency at the output 211.

The test circuit 130 operates as follows. The ring path 209 is completed through the first interconnect layer 121 as soon as the first interconnect layer 121 is formed. The test circuit 130 may then be operated to test the first interconnect layer 121. When the second interconnect layer 122 is formed, the first stage 202 causes the test segment 222 (now present) to be substituted into the ring path 209. The test circuit 130 may then be operated to test the second interconnect layer 122. When the third interconnect layer 123 is formed, the second stage 203 causes the test segment 223 (now present) to be substituted into the ring path 209. The test circuit 130 may then be operated to test the third interconnect layer 123. As each succeeding interconnect layer (e.g., 124, 125, 126, 127) is formed, each corresponding succeeding stage (e.g., 204, 205, 206, 207) causes each corresponding succeeding test segment (e.g., 224, 225, 226, 227) to be substituted into the ring path 209, allowing the test circuit 130 to be operated to test each succeeding interconnect layer. One mechanism for effecting the aforementioned substitution will now be described.

Figure 3:
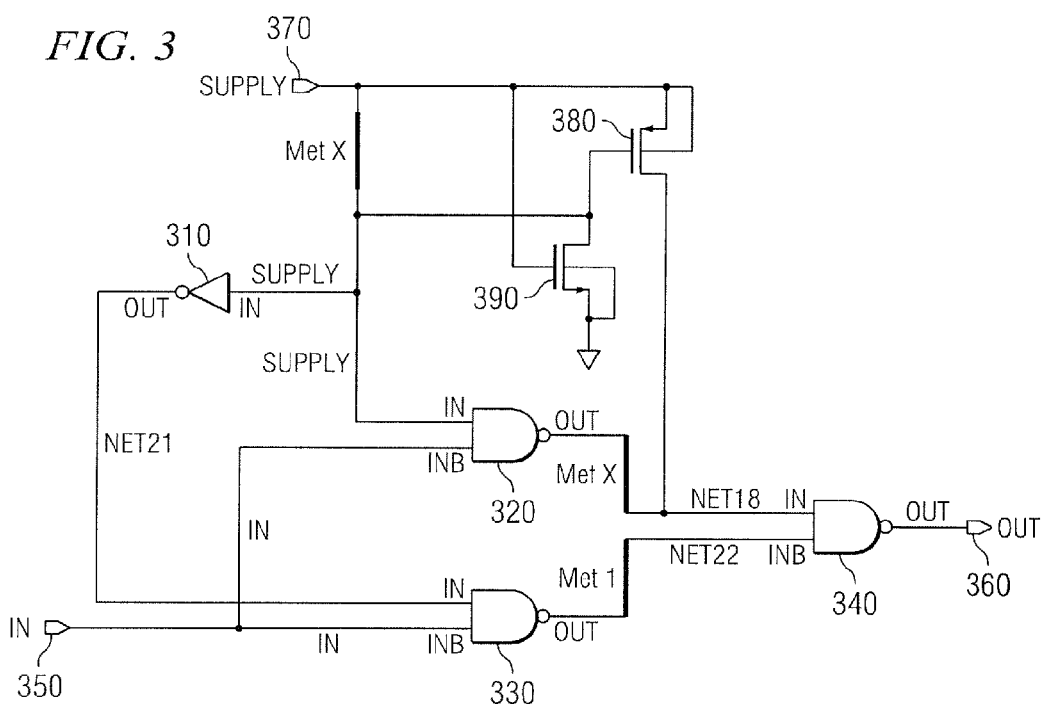
FIG. 3 illustrates a schematic diagram of one embodiment of a dual-inverter stage of the ring oscillator of FIG. 2 constructed according to the principles of the present invention.

Turning now to FIG. 3, illustrated is a schematic diagram of one embodiment of a dual-inverter stage (e.g., the first stage 202 of FIG. 2) of the ring oscillator 200 of FIG. 2 constructed according to the principles of the present invention. The illustrated embodiment of the stage includes an inverter 310, a first NAND gate 320, a second NAND gate 330, a third NAND gate 240, a signal input 350, a signal output 360, a power supply input 370 and pull-up metal-oxide semiconductor field-effect transistors (MOSFETs) 380, 390. The inverter 310, the first NAND gate 320, the second NAND gate 330 and the third NAND gate 340 may be considered as logic circuitry in the embodiment of FIG. 3. The pull-up MOSFET 380 may be a short P-channel MOSFET, and the pull-up MOSFET 390 may be a long N-channel MOSFET.

Three segments are also shown in FIG. 3. One segment, a test segment labeled "Met 1," is in the first interconnect layer 121 of FIG. 1 and is configured to be placed in the ring path after formation of the first interconnect layer. Another segment, a test segment labeled "Met X" and interposing the first and third NAND gates 320, 340, is in an overlying interconnect layer "X" (which may be, for example, any one of the second through seventh interconnect layers 122-127 of FIG. 1, which overlie the first interconnect layer 121). This "Met X" test segment is configured to be substituted for the "Met 1" test segment in the ring path after formation of the interconnect layer "X." Still another segment, also labeled "Met X" but proximate the power supply input 370, is configured to couple the input power supply 370 to the inverter 310 after formation of the interconnect layer "X." The manner in which the logic circuitry places the "Met 1" test segment in the ring path and subsequently substitutes the "Met X" test segment for the "Met 1" test segment will now be described.

Assuming that the first interconnect layer 121 has been formed, but the interconnect layer "X" has not yet been formed, the dual-inverter stage operates as follows. When power is applied to the power supply input, the ring path runs from the signal input 350, through the second NAND gate 330, the "Met 1" test segment and the third NAND gate 340, to the signal output 360. Because the "Met X" segment is missing, the input of the inverter 310 is held low, and the output of the inverter 310 is high as a result. This holds the upper input of the second NAND gate 330 high. Likewise, the pull-up MOSFET 380 holds the upper input of the third NAND gate 340 high. As a result, the first NAND gate 320 is disabled, and the second and third NAND gates 330, 340 double-invert the signal propagating through the stage. The physical properties of the "Met 1" test segment affect the speed of that propagation.

Then, assuming that the interconnect layer "X" has been formed, the dual-inverter stage operates as follows. When power is applied to the power supply input, the ring path runs from the signal input 350, through the first NAND gate 320, the "Met X" test segment and the third NAND gate 340, to the signal output 360. Because the "Met X" segment is now present, the upper input of the first NAND gate 320 is held high. For the same reason, the input of the inverter 310 is held high, and the output of the inverter 310 is low as a result. This holds the upper input of the second NAND gate 320 low. The output of the first NAND gate 320 overcomes the pull-up MOSFET 380. As a result, the second NAND gate 330 is disabled, and the first and third NAND gates 320, 340 double-invert the signal propagating through the stage. The physical properties of the "Met X" test segment affect the speed of that propagation.

Those skilled in the pertinent art should realize that the disclosed embodiments of the in-line test circuit consume a relatively small amount of area on an IC. As a result, the circuit may be replicated and placed at several locations within the IC without significantly increasing the overall cost of the IC. Multiple instances of the circuit may be desirable to measure variations of interconnect properties that may occur over the area of a given IC.

Those skilled in the pertinent art should also understand that significant variations may be made to the disclosed embodiments without departing from the full scope of the invention. Some examples are as follows. The lowest interconnect layer need not be the first interconnect layer. Not all interconnect layers may have corresponding dual-inverter stages; therefore some layers may go untested. Multiple dual-inverter stages may be associated with a given interconnect layer. Multiple interconnect layers may be associated with a given stage. Succeeding stages may not correspond to succeeding interconnect layers. Test segments may or may not be substantially matched in terms of their electrical properties. In the latter case, frequencies detected at the output of the test circuit would be expected to change as subsequent interconnect layers are formed. The logic circuitry may take other forms or include other gates or devices. The present invention is also not limited to particular power supply voltages, numbers of stages or oscillation frequencies.

Figure 4:
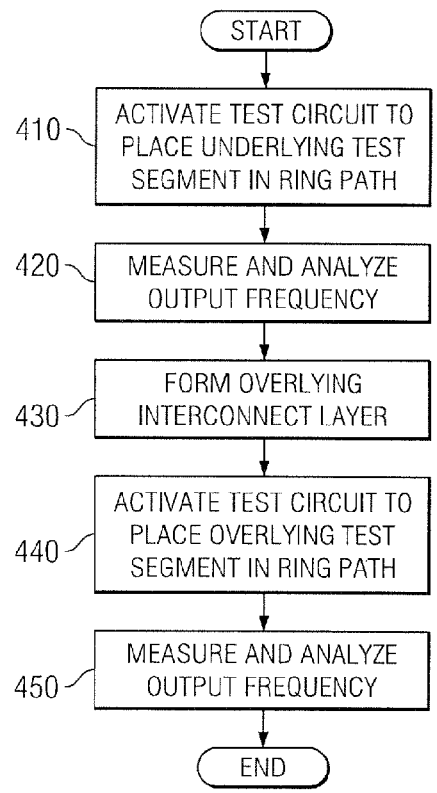
FIG. 4 illustrates a flow diagram of one embodiment of a method of determining interconnect electrical properties carried out according to the principles of the present invention.

Having described several embodiments of an IC and test circuit, a method of testing will now be described. Accordingly, turning now to FIG. 4, illustrated is a flow diagram of one embodiment of a method of determining interconnect electrical properties carried out according to the principles of the present invention. The method begins in a start step (not referenced) after an underlying interconnect layer (e.g., the first interconnect layer) has been formed. In a step 410, the test circuit is activated, which, in the absence of an overlying layer, causes the underlying test segment to be placed in the ring path. Then, in a step 420, the output frequency from the ring oscillator is measured and analyzed to determine the electrical properties of the underlying interconnect layer. Next, in a step 430, an overlying interconnect layer is formed.

Then, in a step 440, the test circuit is again activated, which, given the presence of the overlying layer, causes the test circuit to substitute the overlying test segment for the underlying test segment in the ring path. Then, in a step 450, the output frequency is measured and analyzed to determine the electrical properties of the overlying interconnect layer. The illustrated embodiment of the method then ends, but those skilled in the pertinent art understand that portions of the method may be repeated for subsequent dual-inverter stages and corresponding overlying interconnect layers.

Although the present invention has been described in detail, those skilled in the pertinent art should understand that they can make various changes, substitutions and alterations herein without departing from the spirit and scope of the invention in its broadest form.

What is claimed is:

1. A test circuit for determining electrical properties of an underlying interconnect layer and an overlying interconnect layer of an integrated circuit, comprising:
    a gate chain having a ring path and a stage that comprises:
        an underlying test segment in said underlying interconnect layer;
        an overlying test segment in said overlying interconnect layer; and
        logic circuitry activatible after formation of said underlying interconnect layer and before formation of said overlying interconnect layer to place said underlying test segment in said ring path, and further activatible after said formation of said overlying interconnect layer to substitute said overlying test segment for said underlying test segment in said ring path.

2. The test circuit as recited in claim 1 wherein said underlying interconnect layer is a first interconnect layer of said integrated circuit.

3. The test circuit as recited in claim 1 wherein devices constituting said gate chain are substantially interconnected in said underlying interconnect layer.

4. The test circuit as recited in claim 1 wherein said gate chain has a number of stages corresponding to a number of interconnect layers in said integrated circuit.

5. The test circuit as recited in claim 1 wherein said logic circuitry has an inverter and three NAND gates.

6. The test circuit as recited in claim 1 wherein said gate chain has a frequency divider.

7. The test circuit as recited in claim 1 wherein said underlying and overlying test segments have substantially matched electrical properties.

8. An integrated circuit, comprising:
    a device layer;
    an underlying interconnect layer overlying said device layer;
    an overlying interconnect layer overlying said underlying interconnect layer;
    a principal circuit having devices in said device layer and interconnects in said underlying and overlying interconnect layers; and
    a test circuit for determining electrical properties of said underlying and overlying interconnect layers and thereby testing said principal circuit, including:
    a gate chain having devices in said device layer, a ring path and a stage that comprises:
        an underlying test segment in said underlying interconnect layer,
        an overlying test segment in said overlying interconnect layer, and
        logic circuitry activatible after formation of said underlying interconnect layer and before formation of said overlying interconnect layer to place said underlying test segment in said ring path, and further activatible after said formation of said overlying interconnect layer to substitute said overlying test segment for said underlying test segment in said ring path.

9. The integrated circuit as recited in claim 8 wherein said underlying interconnect layer is a first interconnect layer of said integrated circuit.

10. The integrated circuit as recited in claim 8 wherein said devices constituting said gate chain are substantially interconnected in said underlying interconnect layer.

11. The integrated circuit as recited in claim 8 wherein said gate chain has a number of stages corresponding to a number of interconnect layers in said integrated circuit.

12. The integrated circuit as recited in claim 8 wherein said logic circuitry has an inverter and three NAND gates.

13. The integrated circuit as recited in claim 8 wherein said gate chain has a frequency divider.

14. The integrated circuit as recited in claim 8 wherein said underlying and overlying test segments have substantially matched electrical properties.

* * * * *